US005657202A

United States Patent [19]

Ma

[11] Patent Number: 5,657,202
[45] Date of Patent: Aug. 12, 1997

[54] COMBINATION OF COMPUTER MAINFRAME HOUSING, SOUND PRODUCING UNIT, AND MAINFRAME UNIT

[76] Inventor: Hsi-Kuang Ma, 4F, No. 48, Sec. 2, Chung Cherng Rd., Taipei, Taiwan

[21] Appl. No.: 594,915

[22] Filed: Jan. 31, 1996

[51] Int. Cl.[6] ............................. G06F 1/16; H05K 5/00
[52] U.S. Cl. ............................. 361/683; 181/156
[58] Field of Search ........................ 364/708.1; 381/90, 381/154; 181/156, 199; 361/680–687

[56] References Cited

U.S. PATENT DOCUMENTS

| | | | |
|---|---|---|---|
| 5,025,885 | 6/1991 | Froeschle | 181/156 |
| 5,147,986 | 9/1992 | Cockrum et al. | 181/199 X |
| 5,471,019 | 11/1995 | Maire | 181/156 |

Primary Examiner—Michael W. Phillips
Attorney, Agent, or Firm—Bacon & Thomas

[57] ABSTRACT

A combination of computer mainframe housing, sound producing unit, and mainframe unit, including a housing separated into a front sound chamber and a rear receiving chamber by a vertical partition board, a sound producing unit mounted inside the rear receiving chamber which includes a woofer mounted in a hole on the vertical partition board facing the sound chamber, a sound producing circuit board fixed to the back panel of the housing and connected to the woofer by an electric wire, and a sound tube having one end fastened to a hole on the back panel of the housing and an opposite end facing the vertical partition board, and a mainframe unit mounted inside the rear receiving chamber of the housing which includes a mother board having a plurality of expansion card slots, and a plurality of expansion cards respectively mounted in the expansion card slots.

6 Claims, 2 Drawing Sheets

COMBINATION OF COMPUTER MAINFRAME HOUSING, SOUND PRODUCING UNIT, AND MAINFRAME UNIT

BACKGROUND OF THE INVENTION

The present invention relates to computer mainframes, and relates more particularly to the combination of a computer mainframe housing, a sound producing unit and a mainframe unit respectively mounted inside the computer mainframe housing.

Various multi-media personal computers have been disclosed, and have appeared on the market. However, regular multi-media personal computers do not provide any sound chamber for a woofer. In order to provide a high quality voice output, external speakers are commonly used and installed on the outside and then connected to the mainframe.

SUMMARY OF THE INVENTION

The present invention has been accomplished to provide a housing for computer mainframes which has a sound chamber for reinforcing and prolonging the sound of a woofer.

According to one aspect of the present invention, the combination comprises a housing separated into a front sound chamber and a rear receiving chamber by a vertical partition board, a sound producing unit mounted inside the rear receiving chamber which includes a woofer mounted in a hole on the vertical partition board facing the sound chamber, a sound producing circuit board fixed to the back panel of the housing and connected to the woofer by an electric wire, and a sound tube having one end fastened to a hole on the back panel of the housing and an opposite end facing the vertical partition board. According to another aspect of the present invention, the combination further comprises a mainframe unit mounted inside the rear receiving chamber of the housing which includes a mother board having a plurality of expansion card slots, and a plurality of expansion cards respectively mounted in the expansion card slots.

DETAILED DESCRIPTION OF THE PREFERRED EMBODIMENT

Figure 1:
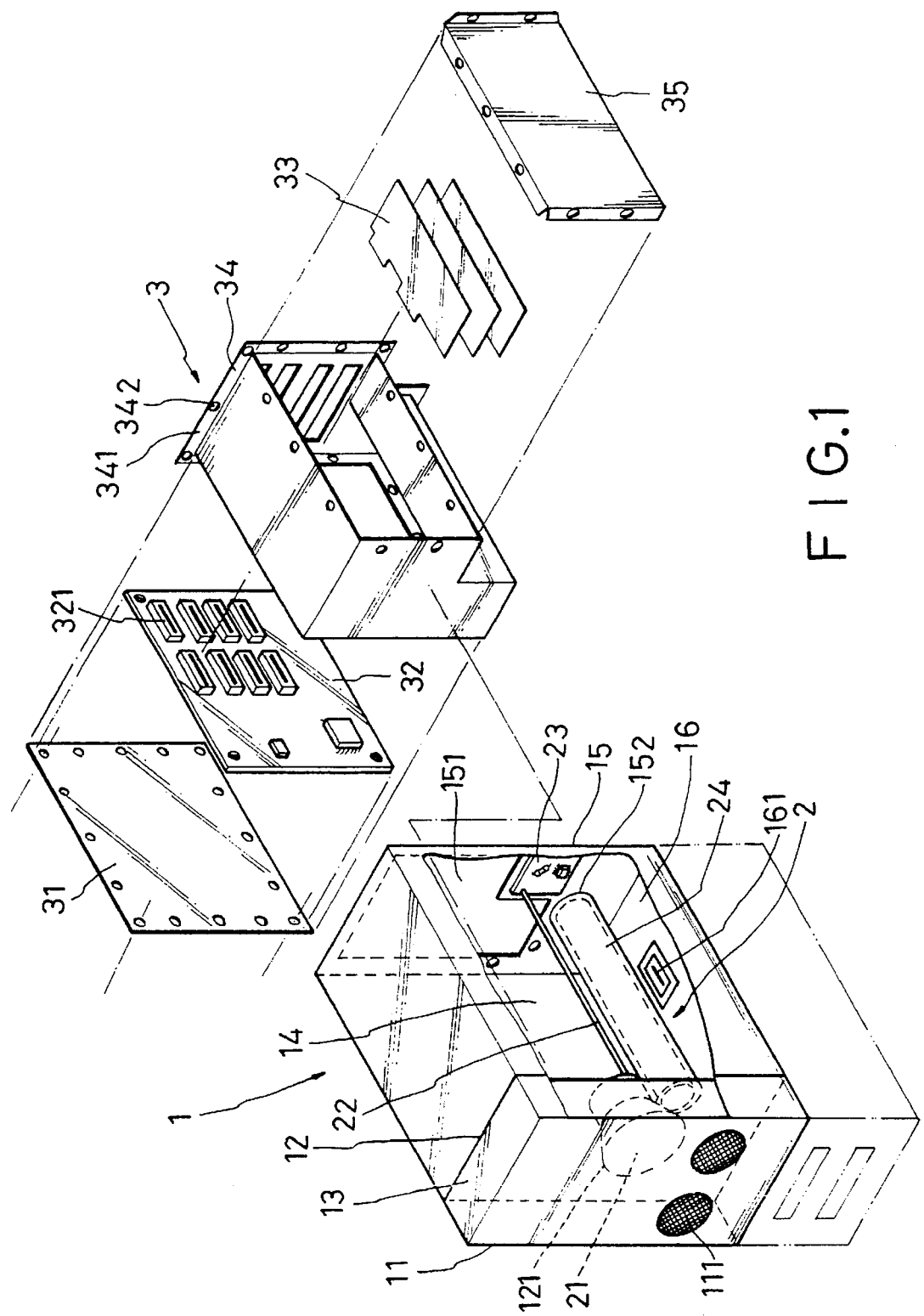
FIG. 1 is an exploded view of the preferred embodiment of the combination of computer mainframe housing, sound producing unit, and mainframe unit according to the present invention.
Figure 2:
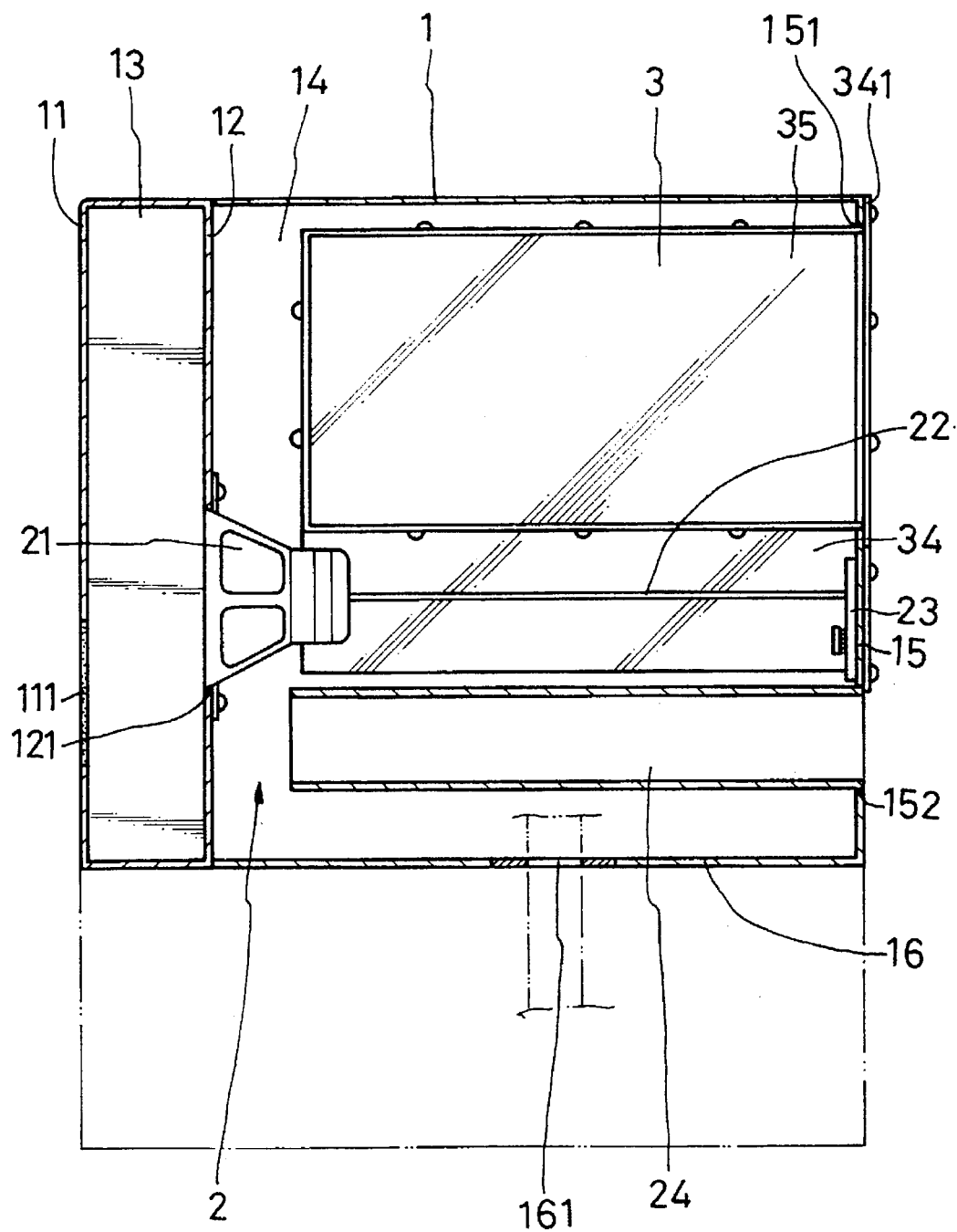
FIG. 2 is a sectional assembly of the combination of computer mainframe housing, sound producing unit, and mainframe unit shown in FIG. 1.

Referring to FIGS. 1 and 2, a combination of computer mainframe housing, sound producing unit, and mainframe unit in accordance with the present invention is generally comprised of a housing 1, a sound producing unit 2, and a mainframe unit 3.

The housing 1 is a rectangular shell having at least one voice output hole 111 in the front panel 11 for output of sound. A vertical partition board 12 is made inside the housing 1 to separate its inside space into a front sound chamber 13 and a rear receiving chamber 14. The vertical partition board 12 has a hole 121, which receives a woofer 21. The back panel 15 of the housing 1 has an opening 151 through which the mainframe unit 3 is inserted into the inside of the housing 1, and a hole 152 below the opening 151. The bottom panel 16 of the housing 1 has a wire hole 161 for the passing of the electric wire. The wire hole 161 is preferably sealed with rubber after the installation of the electric wire.

The sound producing unit 2 is mounted inside the housing 1, comprising a woofer 21 mounted in the hole 121 of the vertical partition board 12 with its cone facing sound chamber 13, a sound generating circuit board 23 fixedly mounted on the back panel 15 inside the receiving chamber 14 and connected to the woofer 21 by an electric wire 22, and a sound tube 24 having one end fastened to the hole 152 of the back panel 15 and an opposite end facing the vertical partition board 12 and spaced from it at a short distance.

The mainframe unit 3 comprises a casing 34 having two opposite lateral open sides, a back board 31 fastened to one open side of the casing 324, a mother board 32 fixedly secured to the back board 31 inside the casing 34 and having a plurality of expansion card slots 321, a plurality of expansion cards 33 respectively fastened to the expansion card slots 321 of the casing 34, a front cover board 35 covered on the opposite open side of the casing 34. The casing 34 further comprises an outward flange 341 around the border of the rear side, and a plurality of through holes 342 on the outward flange 341 for fastening to the back panel 15 of the housing 1 by fastening elements for example screws. The electric wire of .the mother board 32 is inserted through a rubber ring in a wire hole 161 in the bottom panel 16 of the housing 1 and connected to other peripheral apparatus such as hard diskdrive, CD-RROM, etc.

Referring to FIGS. 1 and 2 again, when the mainframe unit 3 is assembled, it is inserted through the opening 151 of the back panel 15 of the housing 1 into the rear receiving chamber 14 and then fixedly secured in place by fastening the outward flange 34 to the back panel 15. When installed, the electric wire of the mainframe unit 3 is inserted through the wire hole 161 of the bottom panel 16 of the housing 1 to the outside.

When the sound producing unit 2 is operated, output sound of the woofer 21 is reinforced and prolonged by the sound chamber 13 and then driven out of the housing 1 through the at least one voice output hole 111. The sound waves are simultaneously guided through the sound tube 24 and the hole 152 of the back panel 15 to the outside. According to the aforesaid design, the level of sound can be as low as 80 Hz.

While only one embodiment of the present invention has been shown and described, it will be understood that various modifications and changes could be made without departing from the spirit and scope of the invention disclosed. For example, the mainframe unit 3 may have any of a variety of profiles that can be conveniently inserted through the opening 151 of the back panel 15 into the rear receiving chamber 14 of the housing 1; the installation of the mainframe unit 3 in the housing 1 can be achieved through a top loading, bottom loading, or side loading instead of the aforesaid rear loading method.

What the invention claimed is:

1. A combination of computer mainframe housing, sound producing unit, and mainframe unit, comprising:

a substantially rectangular housing having a vertical partition board, a woofer mounting hole in said vertical partition board, and a back panel; and a sound producing unit mounted inside said housing between said vertical partition board and said back panel, said sound producing unit comprising a woofer mounted in said woofer mounting hole of said vertical partition board, a sound producing circuit board fixedly mounted on the back panel of said housing and connected to said woofer by an electric wire, and a sound tube for guiding sound waves from said woofer out of said housing.

2. The combination of computer mainframe housing, sound producing unit, and mainframe unit of claim 1 wherein said sound tube has one end extending to a hole in the back panel of said housing and an opposite end facing said vertical partition board and spaced from it by a gap.

3. The combination of computer mainframe housing, sound producing unit, and mainframe unit of claim 1 further comprising a mainframe unit mounted inside said housing, said mainframe unit comprising a casing having an outward flange at one end fixedly secured to the back panel of said housing on the inside, a back board, a mother board fixedly secured to said back board and electrically connected to said woofer, said mother board having a plurality of expansion card slots, and a plurality of expansion cards respectively mounted in said expansion card slots.

4. The combination of computer mainframe housing, sound producing unit, and mainframe unit of claim 3 wherein said housing comprises a bottom panel, a wire hole in said bottom panel and sealed with a rubber ring for the passing of the electric wire of said mother board.

5. The combination of computer mainframe housing, sound producing unit, and mainframe unit of claim 1 wherein said housing comprises a front panel defining with said vertical partition board a sounding chamber, said front panel having at least one voice output hole.

6. The combination of computer mainframe housing, sound producing unit, and mainframe unit of claim 1 wherein said housing has opening at one side through which said mainframe unit is inserted into the space between said back panel and said vertical partition board and then fixed to the inside of said housing.

* * * * *